United States Patent [19]

Nicolas

[11] Patent Number: 4,645,941
[45] Date of Patent: Feb. 24, 1987

[54] PULSE GENERATOR
[75] Inventor: André Nicolas, Asnieres les Dijon, France
[73] Assignee: Commissariat a l'Energie Atomique, France
[21] Appl. No.: 765,444
[22] Filed: Aug. 14, 1985
[30] Foreign Application Priority Data Aug. 14, 1984 [FR] France .................................. 84 12787

[51] Int. Cl.⁴ ............................................. H02M 3/18
[52] U.S. Cl. ........................................ 307/110; 363/59
[58] Field of Search ........................... 363/59; 307/110

[56] References Cited
U.S. PATENT DOCUMENTS 3,863,105 1/1975 Ewanizky ............................. 307/110
4,363,088 12/1982 Yamamoto et al. .................... 363/59

FOREIGN PATENT DOCUMENTS 2098513 7/1970 France .

OTHER PUBLICATIONS

Kubota, Kawasaki, Miyahara and Saad, "Coaxial Marx Generator for Producing Intense Relativistic Electron Beams", Japanese Journal of Applied Physics, vol. 13, No. 2, Feb. 1974, pp. 260–263.
Instruments and Experimental Techniques, vol. 19, No. 4, pp. 1100–1102, New York, "High Speed Voltage-Pulse Generator with Spark-Gap Electrodes Which are Combined with Capacitor Plates", U.S.A.

Primary Examiner—Patrick R. Salce
Assistant Examiner—Anita M. Ault
Attorney, Agent, or Firm—Cesari and McKenna

[57] ABSTRACT

This pulse generator which is of the Marx generator type and is applicable to obtaining high pulse voltages cmprises n+1 capacitors connected n parallel by resistors and spark gap switches for discharging said capacitors into a load circuit, in such a way that if V is the charging voltage of the capacitors, the voltage applied to the load circuit is equal to (n+1)V. This generator is characterized in that the capacitors and spark gap switches form a stack of circular plates, which are provided with axial openings. These plates and the resistors are located in a tight enclosure containing a gas aiding the priming of the spark gap switches, which is triggered by the radiation of a source passing through the opening.

7 Claims, 2 Drawing Figures

PULSE GENERATOR

BACKGROUND OF THE INVENTION

The present invention relates to a pulse generator and more particularly to a high voltage pulse generator, more particularly known in the art as a Marx generator.

The invention applies to the supply of high voltage pulses having a pulse front with a very fast rise time.

The prior art discloses high voltage pulse generators comprising cascade-connected cells, respectively having capacitors charged across resistors. The high voltage pulse is obtained at the generator output by bringing about the discharge of the capacitors across resistors, by means of spark gap switches connected to said capacitors. These spark gap switches are switched in cascade, e.g. using ultraviolet radiation. If the d.c. voltage applied to the generator input for charging the capacitors has a value Vo and if the generator has n capacitors, the voltage of the generator output pulse is equal to $n \cdot V_o$.

In a more detailed manner, this type of high voltage pulse generator or Marx generator comprises, as shown in FIG. 1, a succession of spark gap switches $E_1, E_2, \ldots, E_{n-1}, E_n$. Each of these spark gap switches, such as e.g. switch $E_1$, comprises a first electrode 1 and a second electrode 2. The first electrode of each spark gap switch is connected to the first electrode of the following spark gap switch of said succession of spark gap switches by a first resistor in the case of spark gap switches of rank 1 to $n-1$. These first resistors are designated $R_1, R_2, \ldots, R_n$ in FIG. 1. Thus, for example, resistor $R_1$ connects the first electrode 1 of spark gap switch $E_1$ to the first electrode 3 of spark gap switch $E_2$. In the same way, the second electrode of each spark gap switch is connected by a second resistor to the second electrode of the following spark gap switch of said succession for spark gaps of ranks 1 to $n-1$. These second resistors are designated $R'_1, R'_2, \ldots, R'_n$ in FIG. 1. For example, the second resistor $R'_1$ connects the second electrode 2 of spark gap switch $E_1$ to the second electrode 4 of spark gap switch $E_2$. In addition, the second electrode of each spark gap switch is connected by a capacitor to the first electrode of the following spark gap switch of the succession of spark gaps for spark gaps of ranks 1 to $n-1$. These capacitors are designated $C_1, C_2, \ldots, C_{n-1}, C_n$ in FIG. 1. Thus, for example capacitor $C_1$ connects the second electrode 2 of spark gap switch $E_1$ to the first electrode 3 of spark gap switch $E_2$.

The generator shown in FIG. 1 is applied by a d.c. voltage source 5, which is connected by a second resistor $R'$ to a common point A between the second electrode 2 of spark gap switch $E_1$ of rank 1 and the second resistor $R'_1$ connecting said second electrode of spark gap switch $E_1$ to the second electrode 4 of spark gap switch $E_2$ of rank 2. The second electrode 7 of spark gap switch $E_n$ of rank n is connected to a first coating 9 of an output capacitor C, a first resistor R connecting the first electrode 6 of spark gap switch $E_n$ of rank n to a first coating 8 of output capacitor C. The output voltage of the generator shown in the drawing is a voltage of pulse type and which appears at the time of triggering the spark gap switches. This voltage can be applied to a load circuit L. It is available on the first coating 8 of output capacitor C. In the example shown in FIG. 1, the generator has $n-1$ capacitors if the input d.c. voltage applied by source 5 is equal to Vo, the output pulse voltage being equal to $(n-1) \cdot V_o$. In FIG. 1, M designates the reference earth.

The realization of a Marx generator of the type whose circuit has just been described generally takes place by using capacitors protected by a covering, equipped with a group of terminals making it possible to connect the different components of said circuit, e.g. paper capacitors. These capacitors are contained in metal or plastic boxes having insulators for the output terminals of the capacitors. It is also possible to use capacitors having ceramic dielectrics, said capacitors being sealed and consequently far from easy to manufacture.

Marx generators whose circuits are constructed in the manner described hereinbefore and which use paper capacitors contained in metal boxes or sealed ceramic dielectric capacitors suffer from the important disadvantage of a lack of compactness, as a result of the supplementary overall dimensions due to the coverings and connections. Thus, the electrical energy which can be supplied by the known Marx generators is reduced and the equivalent inductance of the generator is high, which is prejudicial to the power supplied.

SUMMARY OF THE INVENTION

The object of the present invention is to obviate the disadvantages of the known pulse generators of the Marx type and more particularly aims at providing a very compact pulse generator having a greatly reduced inductance compared with the known generators. This compactness is more particularly obtained through the use of ceramic capacitors arranged in stack form.

The present invention more specifically relates to a pulse generator having a succession of spark gap switches ranging from rank 1 to rank n, each having first and second electrodes, the first electrode of each spark gap switch being connected by a first resistor to the first electrode of the following spark gap switch of said succession, for spark gap switches of rank 1 to $n-1$, the second electrode of each spark gap switch being connected by a second resistor $R'_1$ to the second electrode of the following spark gap switch of said succession, for spark gap switches of rank 1 to $n-1$, the second electrode of each spark gap switch also being connected to a capacitor to the first electrode of the following spark gap switch of said succession, for spark gap switches of rank 1 to $n-1$, said generator being supplied by a d.c. voltage source connected by a second resistor of a common point between the second electrode of the spark gap switch of rank 1 and the second resistor connecting said second electrode of the spark gap switch of rank 1 to the second electrode of the spark gap switch of rank 2, the second electrode of the spark gap switch of rank n being connected to a second coating of an output capacitor, a first resistor connecting the first electrode of the spark gap switch of rank n to the first coating of the output capacitor, the output voltage being available on said first coating, wherein the electrodes of the spark gap switches are parallel conductor plates forming a stack, the capacitors comprising at least two planar conductive coatings which, for each capacitor, are respectively in contact with the second electrode of the corresponding spark gap switch of said succession and to the first electrode of the following spark gap switch in said succession, two facing electrodes of two successive spark gap switches being separated by an insulating spacer and the electrodes of the same spark gap switch also being separated by an insulating spacer, the electrodes and capacitors being located in a tight enclosure containing a gas, the electrodes and the capacitors having aligned openings, along an axis passing through the stack, the triggering of the spark gap switch being brought about by ultraviolet radiation applied by a source to one of the openings.

According to another feature, the capacitors have metal coatings and ceramic dielectrics.

According to another feature, the plates constituting the electrodes of the spark gap switches, as well as the coatings of the capacitors and the insulating coatings of said capacitors have a circular shape, the spacers being annular, the axis along which said openings are located corresponding to the axis of said plates, said coatings and said spacers.

According to another feature, the contact between the coating of each capacitor and the electrode of the corresponding spark gap switch is assured by a layer of a flexible conductive material.

According to another feature, the first and second resistors have the same value.

According to another feature, the capacitors of the stack, as well as the output capacitor have the same value.

According to another feature, the tight enclosure is a metal enclosure insulated from the plates constituting the electrodes of the spark gap switches and insulated from the capacitor coatings.

BRIEF DESCRIPTION OF THE DRAWINGS

The features of the invention can best be gathered from the following description of preferred embodiments relative to the drawings, wherein show.

DETAILED DESCRIPTION OF THE PREFERRED EMBODIMENTS

Figure 1:
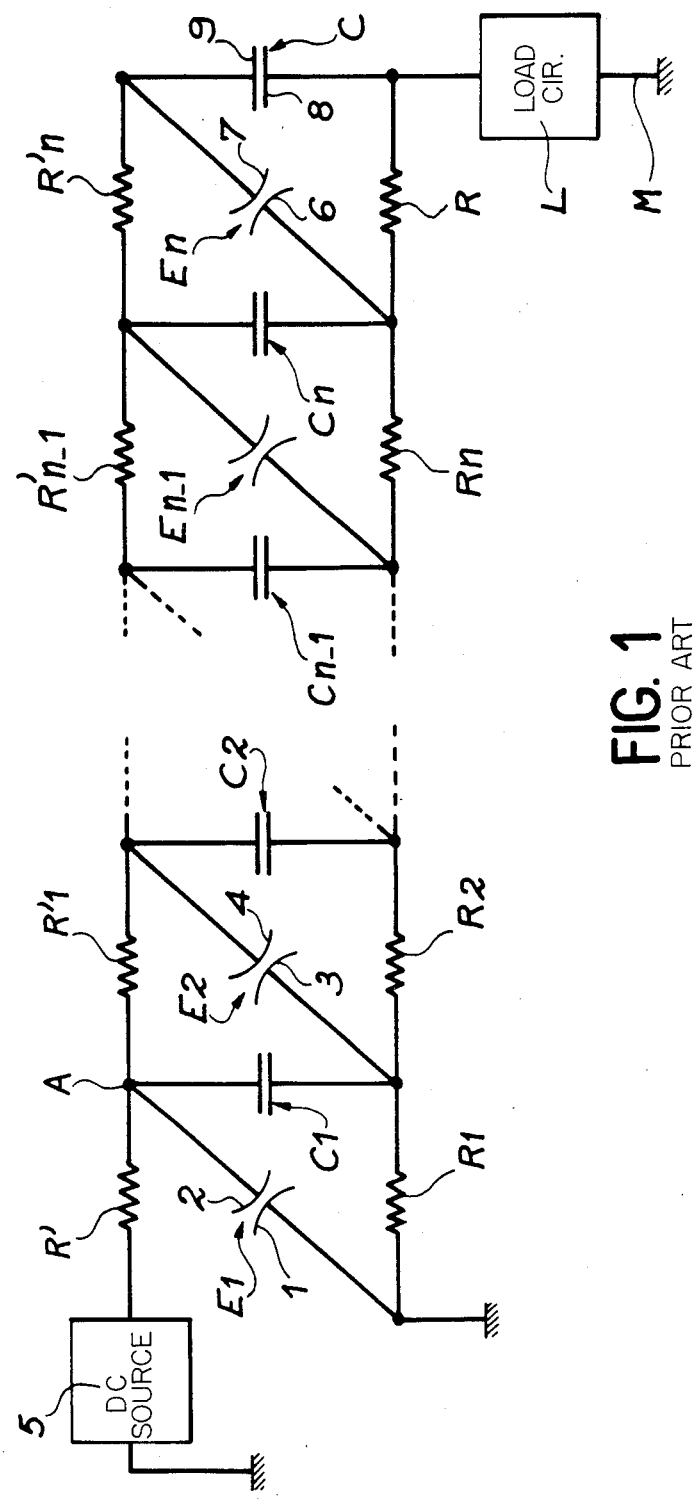
FIG. 1 already described, diagrammatically the circuit of a pulse generator of the Marx generator type and known from the prior art.
Figure 2:
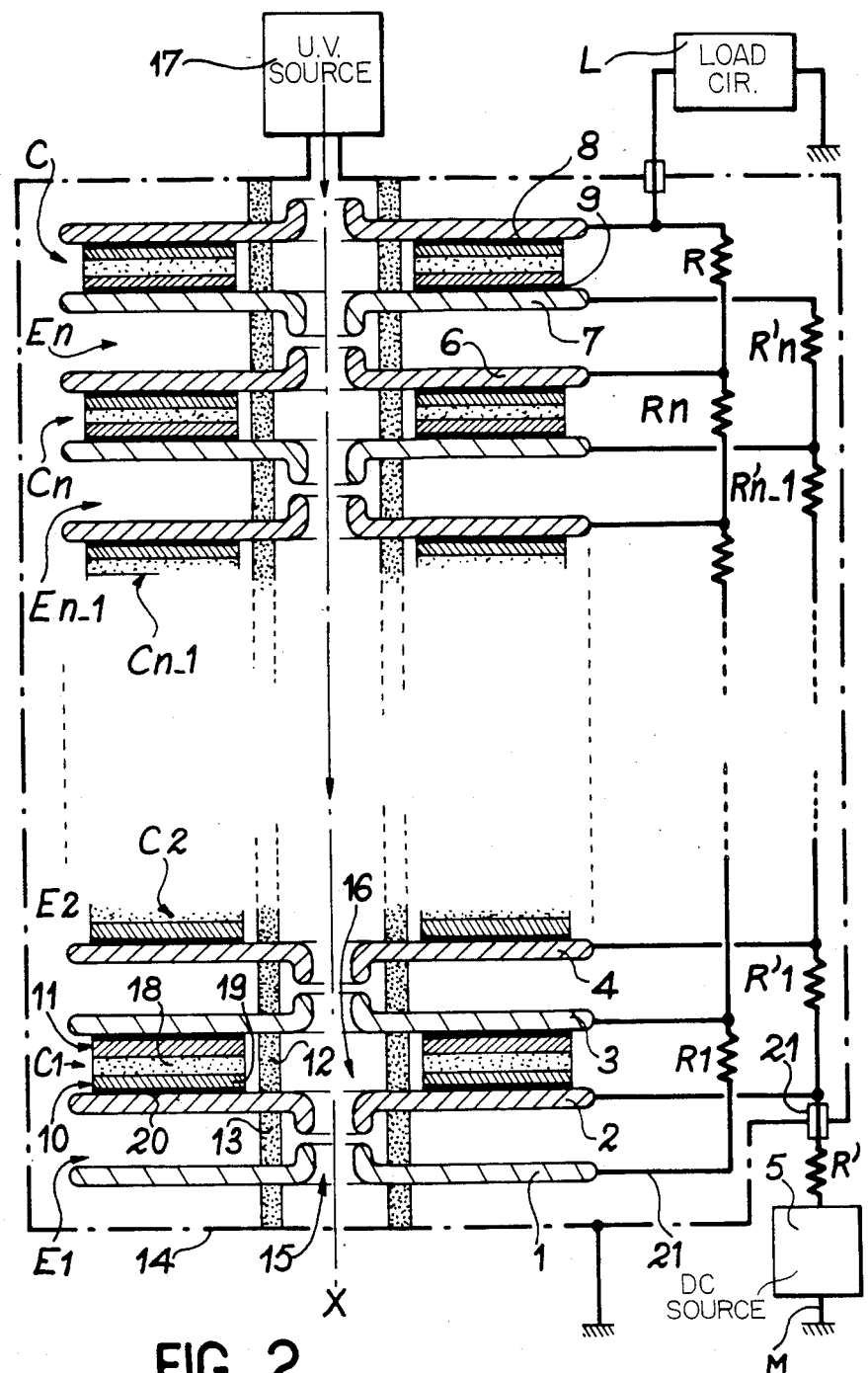
FIG. 2 diagrammatically and in section, a pulse generator using the circuit of FIG. 1 in which, according to the invention, the capacitors and the spark gap switches are stacked.

The pulse generator according to the invention show in FIG. 2 is in accordance with the circuit of FIG. 1. The same elements carry the same references in both FIGS. 2 and 1.

Thus, it is possible to see spark gap switches $E_1$, $E_2$, ..., $E_n$, capacitors $C_1$, $C_2$, ..., $C_n$, C, first resistors $R_1$, ..., $R_n$, R, second resistors $R'$, $R'_1$, $R'_{n-1}$, $R'_n$. The d.c. voltage source 5 is also shown and is connected to the second electrode 2 of spark gap switch $E_1$ via resistor $R'$. The load L is also shown, as are the first and second electrodes 1, 2 of spark gap switch $E_1$, electrodes 3, 4 of spark gap switch $E_2$, electrodes 6, 7 of spark gap switch $E_n$ and the coatings 8, 9 of output capacitor C.

According to the invention, electrodes 1, 2, 3, 4, ..., of spark gap switches $E_1$, ..., $E_n$ are parallel conductive metal plates forming a stack. Each of the capacitors $C_1$, $C_2$, ..., $C_n$, C comprises at least two planar metal conductive coatings, which are respectively in contact with the second electrode of the corresponding spark gap switch of the succession of spark gap switches and with the first electrode of the following spark gap switch in said succession. Thus, for example, capacitor $C_1$ comprises a planar conductive coating 10 in contact with the second electrode 2 of the first spark gap switch $E_1$, and with a second planar coating 11 in contact with the first electrode 3 of the second spark gap switch $E_2$. The facing electrodes of two successive spark gap switches are separated by an insulating spacer. The electrodes of the same spark gap switch are also separated by an insulating spacer. In the embodiment shown in FIG. 2, electrodes 2, 3 of the successive spark gap switches $E_1$, $E_2$ are separated by an insulating spacer 12. Electrodes 1, 2 of spark gap switch $E_1$ are separated by an insulating spacer 13.

The electrodes and capacitors described hereinbefore are located in a tight enclosure 14 diagrammatically shown in FIG. 2. This tight enclosure contains a gas which is able to assist the triggering of the spark gap switches by a priming phenomenon. For this purpose, the electrodes have openings such as 15, 16, which are aligned along an axis X passing through the stack. When all the capacitors have been charged by means of the power supply 5, the triggering of the spark gap switches is brought about by ultraviolet radiation, e.g. supplied by a source 17, applying said radiation to one of the openings described hereinbefore.

In a preferred manner, all the capacitors $C_1$, $C_2$, ..., $C_n$, C have the same value. In the same way, the first resistors $R_1$, $R_n$, R and the second resistors $R'$, $R'_1$, ..., $R'_n$ have the same values.

The coatings 10, 11 of the capacitors are planar metal coatings, whilst the dielectric 18 placed in the form of one or more layers between the coatings is made from a ceramic material. The capacitor coatings can be constituted e.g. by a metal layer 19, in contact with the corresponding electrode by means of a flexible conductive layer, e.g. of rubber 20, in which is incorporated a conductive material. This conductive rubber layer makes it possible to absorb the shocks and vibrations to which the generator can be exposed, as well as the stresses occurring during the triggering of the spark gap switches.

The plates constituting the electrodes of the spark gap switches, as well as the capacitor coatings of the insulating layers of the capacitors all have a circular configuration. Axis X along which are located the openings corresponds to the axis of said plates and said coatings. The insulating spacers 12, 13 are annular, and have the same axis X.

Tight enclosure 14 is a metal enclosure insulated from the plates constituting the electrodes, the spark gap switches, as well as the capacitor coatings, the metal enclosure has tight insulating bushings or ducts 21 to permit the connection, outside said enclosure, of source 5 and charge L. This enclosure is preferably connected to the reference earth.

In known manner, the aforementioned generator having n+1 capacitors makes it possible, when the voltage of the power supply 5 has a value Vo, to obtain at the output of said generator a voltage of value $(n+1) \cdot V_o$.

Due to the fact that the complete column of spark gap switches is at the same pressure in enclosure 14, as a result of the openings made in the spark gap switches and in the capacitors, the triggering of a spark gap switch is stimulated by the ultraviolet radiation emitted by its collaterals, so that there is a synchronization of the triggering of the stack of spark gap switches and consequently a reduction in the speed of the rise front of the pulse obtained at the generator output.

The generator described hereinbefore has a compact shape, due to the stack of spark gap switches and capacitors.

What is claimed is:

1. A pulse generator having a succession of spark gap switches ranging from rank 1 to rank n, each having first and second electrodes, the first electrode of each spark gap switch being connected by a first resistor to the first electrode of the following spark gap switch of said succession, for spark gap switches of rank 1 to n−1, the second electrode of each spark gap switch being connected by a second resistor $R'_1$ to the second electrode of the following spark gap switch of said succession, for spark gap switches of rank 1 to n−1, the second electrode of each spark gap switch also being connected to a capacitor to the first electrode of the following spark gap switch of said succession, for spark gap switches of rank 1 to n−1, said generator being supplied by a d.c. voltage source connected by a second resistor of a common point between the second electrode of the spark gap switch of rank 1 and the second resistor connecting said second electrode of the spark gap switch of rank 1 to the second electrode of the spark gap switch of rank 2, the second electrode of the spark gap switch of rank n being connected to a second coating of an output capacitor, a first resistor connecting the first electrode of the spark gap switch of rank n to the first coating of the output capacitor, the output voltage being available on said first coating, wherein the electrodes of the spark gap switches are parallel conductor plates forming a stack, the capacitors comprising at least two planar conductive coatings which, for each capacitor, are respectively in contact with the second electrode of the corresponding spark gap switch of said succession and to the first electrode of the following spark gap switch in said succession, two facing electrodes of two successive spark gap switches being separated by an insulating spacer and the electrodes of the same spark gap switch also being separated by an insulating spacer, the electrodes and capacitors being located in a tight enclosure containing a gas, the electrodes having aligned openings, along an axis passing through the stack, the triggering of the spark gap switch being brought about by ultraviolet radiation applied by a source to one of the openings.

2. A generator according to claim 1, wherein the capacitors have planar metal coatings and ceramic dielectrics.

3. A generator according to claim 2, wherein the plates constituting the electrodes of the spark gap switches, as well as the capacitor coatings and insulating layers of said capacitors are circular, the spacers having an annular configuration, along which is located the openings corresponding to the axis of said plates, said coatings and said spacers.

4. A generator according to claim 3, wherein the contact between the coating of each capacitor and the electrode of the corresponding spark gap switch is ensured by a layer of flexible conductive material.

5. A generator according to claim 3, wherein the first and second resistors have the same value.

6. A generator according to claim 3, wherein the capacitors of the stack, as well as the output capacitors, have the same value.

7. A generator according to claim 3, wherein the tight enclosure is a metal enclosure insulated from the plate constituting the electrodes of the spark gap switches and insulated from the capacitor coatings.

* * * * *